(12) United States Patent
Chen et al.

(10) Patent No.: US 11,937,394 B2
(45) Date of Patent: Mar. 19, 2024

(54) INPUT/OUTPUT MODULE LOCKING MECHANISM

(71) Applicant: Quanta Computer Inc., Taoyuan (TW)

(72) Inventors: Chao-Jung Chen, Taoyuan (TW); Kun-Pei Liu, Taoyuan (TW); Te-Hao Hu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 114 days.

(21) Appl. No.: 17/845,319

(22) Filed: Jun. 21, 2022

(65) Prior Publication Data

US 2023/0345661 A1 Oct. 26, 2023

Related U.S. Application Data (60) Provisional application No. 63/332,975, filed on Apr. 20, 2022.

(51) Int. Cl.
*H05K 7/14* (2006.01)
(52) U.S. Cl.
CPC .................................. *H05K 7/1489* (2013.01)
(58) Field of Classification Search
CPC ...... H05K 7/1489; H05K 7/14; H05K 5/1487; H05K 7/18; H05K 5/00
USPC ............ 361/679.31–679.39, 679.55–679.59, 361/724–727, 752, 754–756, 759, 788, 361/801; 312/223.1–233.2; 439/159–160
See application file for complete search history.

(56) References Cited

U.S. PATENT DOCUMENTS

| | | | |
|---|---|---|---|
| 2012/0099284 A1* | 4/2012 | Boetzer ............ | H01R 13/62905 361/756 |
| 2014/0233182 A1* | 8/2014 | Demange ............. | H05K 7/1409 361/679.58 |

* cited by examiner

*Primary Examiner* — Jerry Wu
(74) *Attorney, Agent, or Firm* — NIXON PEABODY LLP (57) ABSTRACT

A module comprises a tray, a mechanical switch, and a linkage system. The tray is configured to receive a circuit board thereon. The mechanical switch is mounted to the tray and movable between an unsecured position and a secured position. The linkage system is mechanically coupled to the mechanical switch, and moves between an unsecured configuration and a secured configuration in response to the mechanical switch moving between the unsecured position and the secured position. When the module is coupled to a computing device and the linkage system is in the secured configuration, the linkage system engages the computing device, such that the module is locked to the computing device. When the module is coupled to the computing device and the linkage system is in the unsecured configuration, the linkage system is disengaged from the computing device, such that the module is unlocked from the computing device.

18 Claims, 6 Drawing Sheets

INPUT/OUTPUT MODULE LOCKING MECHANISM

CROSS-REFERENCE TO RELATED APPLICATIONS

This application claims priority from and the benefit of U.S. Provisional Patent Application Ser. No. 63/332,975, filed on Apr. 20, 2022, titled "IO Install/Eject Module Design," which is hereby incorporated by reference herein in its entirety.

FIELD OF THE INVENTION

The present invention relates generally to systems and methods for securing an input/output module to a computing device, and more specifically, to systems and methods for securing an input/output module to a computing device using a linkage system.

BACKGROUND OF THE INVENTION

Computing devices (such as servers) often have the capability to accept input/output (I/O) modules that improve and/or expand the functionality of the computing device. Typically, an I/O module can be inserted into a slot defined in a housing of the computing device, or inserted into a sled that can itself be inserted into a slot defined in the housing. I/O modules can include various components that allows the I/O module to be installed and removed from the computing device and allow the I/O module to be serviced. However, these designs are often overly complicated and do not allow for the I/O module to be easily serviced. Thus, improved I/O modules are needed.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a module is configured to be coupled to a computing device. The module comprises a tray, a mechanical switch, and a linkage system. The tray is configured to receive a circuit board thereon. The mechanical switch is coupled to the tray and is movable between an unsecured position and a secured position. The linkage system is mechanically coupled to the mechanical switch, and is movable between an unsecured configuration and a secured configuration in response to the mechanical switch moving between the unsecured position and the secured position. When the module is coupled to the computing device and the linkage system is in the secured configuration, the linkage system is engaged with a portion of the computing device, such that the module is locked to the computing device. When the module is coupled to the computing device and the linkage system is in the unsecured configuration, the linkage system is disengaged from the portion of the computing device, such that the module is unlocked from the computing device.

In some implementations, the mechanical switch moves linearly between the unsecured position and the secured position, and the linkage system is configured to convert the linear movement of the mechanical switch into pivoting movement to engage the portion of the computing device.

In some implementations, the linkage system includes at least one linear body coupled to the mechanical switch, and at least one pivoting body coupled to the at least one linear body. The at least one linear body causes the at least one pivoting body to pivot in response to the mechanical switch moving between the unsecured position and the secured position.

In some implementations, in response to the mechanical switch moving between the unsecured position and the secured position, the at least one linear body moves linearly between a first position and a second position, and in response to the at least one linear body moving linearly between the first position and the second position, the at least one pivoting body pivots between a first position between a second position.

In some implementations, when the at least one pivoting body pivots from the first position to the second position, the at least one pivoting body engages the portion of the computing device, and when the at least one pivoting body pivots from the second position to the first position, the at least one pivoting body disengages from the portion of the computing device.

In some implementations, the tray is configured to be received by a sled that can be inserted into a slot defined in a housing of the computing device to thereby couple the module to the computing device. The sled has a protrusion extending therefrom, and when the tray is received by the sled and the mechanical switch moves from the unsecured position to the secured position, the at least one pivoting body pivots from a first position to a second position to engage the protrusion.

In some implementations, the at least one pivoting body includes a first jaw, a second jaw, and a groove defined between the first jaw and the second jaw. The groove receives the protrusion therein when the tray is received within the slot and the at least one pivoting body pivots to the second position, such that the first jaw and the second jaw prevent the tray from being removed from the slot.

In some implementations, the linkage system includes a (i) first linear body coupled to the mechanical switch, (ii) a first pivoting body coupled to the first linear body and pivotally coupled to the tray via a first pivot point, (iii) a second linear body coupled to the first pivoting body, and (iv) a second pivoting body coupled to the second linear body and pivotally coupled to the tray via a second pivot point.

In some implementations, movement of the mechanical switch between the unsecured position and the secured position causes the first linear body to move linearly relative to the tray.

In some implementations, the linear movement of the first linear body causes the first pivoting body to pivot relative to the tray about the first pivot point.

In some implementations, the pivoting movement of the first pivoting body causes the second linear body to move linearly relative to the tray.

In some implementations, when the module is coupled to the computing device, the linear movement of the second linear body causes the second pivoting body to pivot relative to the tray about the second pivot point, such that the second pivoting body engages the portion of the computing device.

In some implementations, the mechanical switch moves linearly between the unsecured position and the secured position.

In some implementations, the linear movement of the mechanical switch between the unsecured position and the secured position causes the first linear body to move in a first linear direction and the second linear body to move in a second linear direction. The first linear direction is perpendicular to the second linear direction. In some implementations, the linear movement of the mechanical switch between the unsecured position and the secured position causes the first pivoting body and the second pivoting body to pivot in identical pivoting directions to the tray about their respective pivot points.

In some implementations, the tray is configured to be inserted into the computing device only when the linkage system is in the unsecured configuration.

In some implementations, the tray is configured to be inserted into (i) a slot defined in the computing device, or (ii) a sled that can be inserted into the slot defined in the computing device.

In some implementations, the mechanical switch includes an externally threaded portion and a collar that abuts the tray, and the collar has an internally threaded portion.

In some implementations, the externally threaded portion of the mechanical switch is configured to engage the internally threaded portion of the collar in response to the mechanical switch being rotated while in the secured position, thereby locking the mechanical switch in the secured position.

In some implementations, the mechanical switch is biased toward the unsecured position, such that the linkage system is biased toward the secured configuration.

According to certain aspects of the present disclosure, a system comprises a computing device and a module. The computing device has a slot defined therein, and includes a sled that is receivable within the slot. The module is receivable within the sled, to thereby couple the module to the computing device. The module includes a tray, a mechanical switch, and a linkage system. The tray is configured to receive a circuit board thereon and to be inserted into the sled. The mechanical switch is coupled to the tray, and is movable between an unsecured position and a secured position. The linkage system is mechanically coupled to the mechanical switch, and is movable between an unsecured configuration and a secured configuration in response to the mechanical switch moving between the unsecured position and the secured position. When the module is received within the sled and the linkage system is in the secured configuration, the linkage system is engaged to a portion of the sled, such that the module is locked to the sled. When the module is received within the sled and the linkage system is in the unsecured configuration, the linkage system is disengaged from the portion of the sled, such that the module is unlocked from the sled.

The above summary is not intended to represent each embodiment or every aspect of the present disclosure. Rather, the foregoing summary merely provides an example of some of the novel aspects and features set forth herein.

The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Computing devices (such as servers) often have the capability to accept input/output (I/O) modules that improve and/or expand the functionality of the computing device. Aspects of the present disclosure relate to an I/O module that can be installed in a computing device using a mechanical switch and a linkage system. The mechanical switch extends outward from the I/O module and can be moved between an unsecured position and a secured position by a user. Moving the mechanical switch between the unsecured position and the secured position moves the linkage system between an unsecured configuration and a secured configuration. In the secured configuration, the linkage system can engage a portion of the computing device, and prevent the I/O module from being removed from the computing device.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
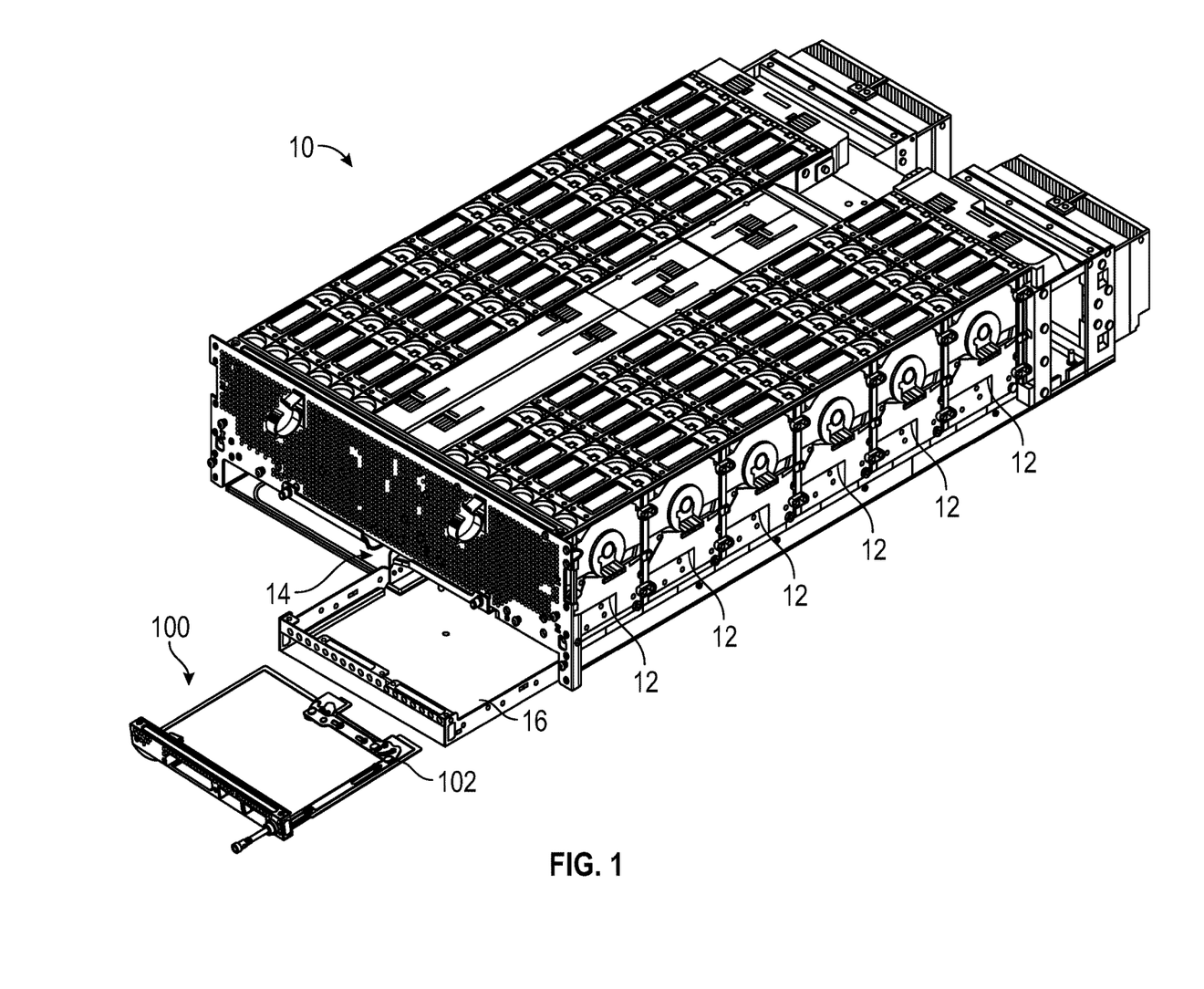
FIG. 1 is perspective view of a computing device and a module that can be coupled to the computing device, according to certain aspects of the present disclosure.

FIG. 1 illustrates a computing device 10 and an I/O module 100 (referred to herein as module 100) that can be inserted into or otherwise coupled to the computing device 10. In FIG. 1, the computing device 10 includes a rack of hard drives 12 that may be used as part of a server device. Generally, the computing device 10 will include a backplane board that electrically connects the hard drives 12. The module 100 includes a circuit board 102 that can be electrically connected to the backplane board of the computing device 10, when the module 100 is inserted into or coupled to the computing device 10.

In the illustrated implementation, the housing of the computing device 10 defines an internal slot 14, and includes a sled 16 that can be slid into and out of the slot 14. The module 100 can be inserted onto the sled 16, and when the sled 16 is slid into the slot 14, the circuit board 102 of the module 100 connects to the backplane board, thereby electrically connecting the circuit board 102 to the backplane board and the hard drives 12. As is discussed in more detail herein, the sled 16 will generally include one or more features that aid in enabling the module 100 to be secured to the sled 16, such that the module 100 is maintained within the computing device 10 when the sled is position in the slot 14.

In other implementations, the computing device 10 does not include the sled 16. In these implementations, the module 100 can be inserted directly into the slot 14 and secured to the interior of the computing device 10 within the slot 14. The interior of the computing device 10 within the slot 14 will generally include the same or similar features as the sled 16, which aid in enabling the module 100 to be secured to the computing device 10 within the slot 14. Thus, while the present disclosure generally describes how the module 100 can be engaged to the sled 16, the disclosure also applies to implementations without the sled 16, where the module 100 is inserted directly into the slot 14.

Disclosure of how the module 100 can engage and/or be locked to a portion of the computing device 10 applies both the implementations where the module 100 is inserted into the sled 16, and implementations where the module 100 is inserted directly into the computing device 10 without the sled 16. As used herein, the module 100 is considered to be coupled to the computing device 10 at least when the module 100 is inserted into the slot 14 or into the sled 16 (regardless of whether the sled 16 is itself inserted into the slot 14). When the module 100 is coupled to the computing device 10, the module 100 can be engaged to a portion of the computing device 10 so that the module 100 is locked to the computing device 10, or be disengaged from the portion of the computing device 10 so that the module 100 is unlocked from the computing device 10. Thus, the module 100 can be coupled to the computing device 10 without being locked to the computing device 10.

Figure 2:
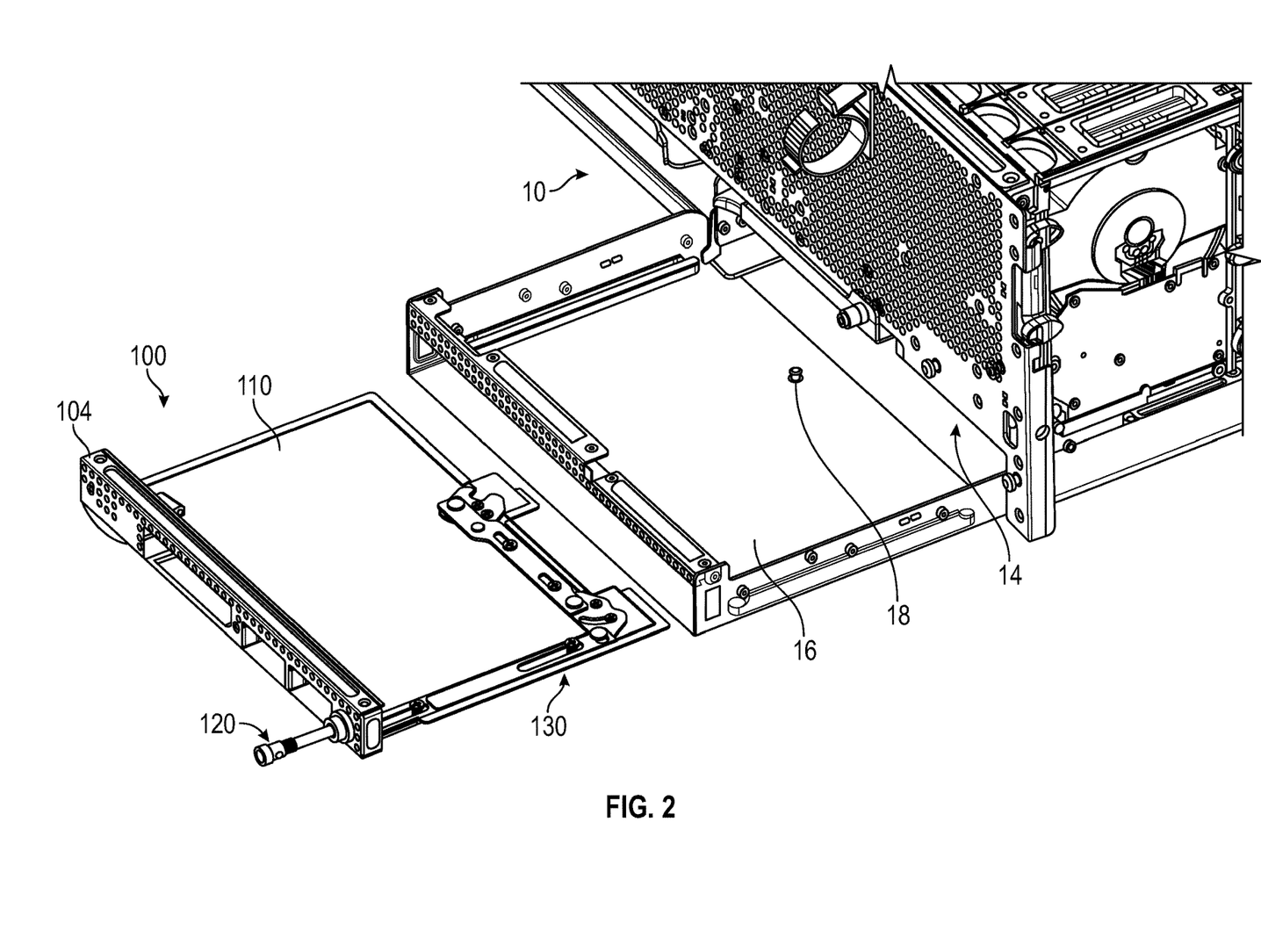
FIG. 2 is a zoomed-in perspective view of the module of FIG. 1, and of a sled of the computing device of FIG. 1 that the module can be inserted into, according to certain aspects of the present disclosure.

FIG. 2 is a zoomed-in version of FIG. 1 that shows further details of the module 100. In FIG. 2, the circuit board 102 (FIG. 1) has been removed for ease of viewing. The module 100 includes a front panel 104, a tray 110, a mechanical switch 120, and a linkage system 130 mechanically coupled to the mechanical switch 120. The tray 110 can receive the circuit board 102 thereon, such that the linkage system 130 is positioned between the tray 110 and the circuit board 102. The front panel 104 extends at a generally perpendicular angle to the tray 110. In some implementations, the front panel 104 is electrically connected to the circuit board 102 and includes one or more connectors or ports, so that external peripheral devices can be electrically connected to the circuit board 102. The mechanical switch 120 is coupled to the tray 110 and is movable between an unsecured position and a secured position.

FIG. 2 also illustrates the sled 16 extending away from the slot 14 of the computing device 10. As can be seen, the sled 16 has a generally hollow interior into which the module 100 can fit. The sled 16 can then be retracted into the slot 14, such that the front panel 104 of the module 100 is aligned with the exterior of the computing device 10. As is discussed in more detail herein, the sled 16 includes a protrusion 18 which the linkage system 130 of the module 100 can engage, in order to lock the module 100 to the sled 16 when the module 100 is positioned within the sled 16.

In the illustrated implementation, the mechanical switch 120 is formed as a push button that extends outward from the front panel 104 away from the tray 110. As is discussed in more detail herein, the end of the push button can be pushed toward the front panel 104 and pulled away from the front panel 104, in order to lock the module 100 to the computing device 10. Thus, in the illustrated implementation, the unsecured position is an extended position (e.g., the mechanical switch 120 extends away from the front panel 104 and/or the tray 110), and the secured position is a retracted position (e.g., the mechanical switch is retracted into the front panel 104 and/or the tray 110). In other implementations however, the mechanical switch 120 can be formed differently. For example, the mechanical switch could be a rotating device (e.g., a rotating knob or wheel), a toggle device (e.g., a paddle switch or a lever), and/or other devices. In these implementations, the unsecured and secured positions can be different than the illustrated implementation. For example, a rotating device would generally not extend from or retract into the front panel 104 and/or the tray 110, but would instead rotate relative to the front panel 104 and/or the tray 110 between the unsecured and secured positions.

Figure 3:
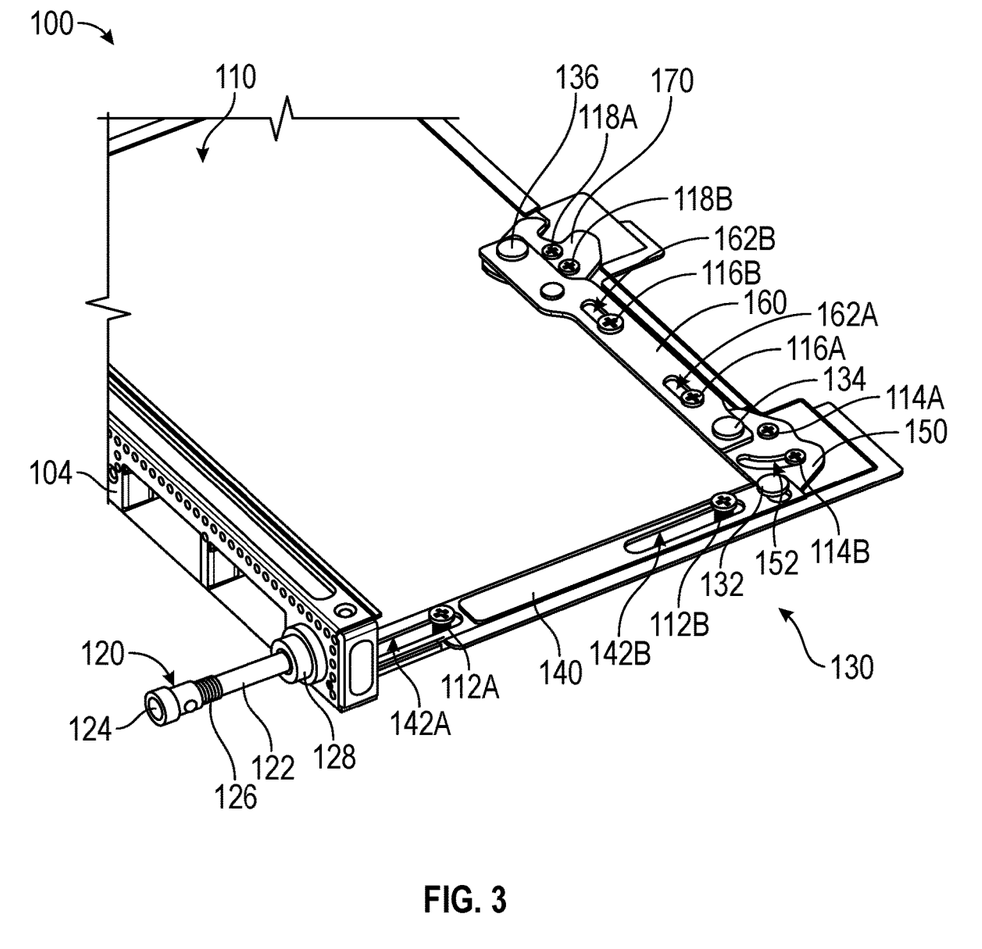
FIG. 3 is a perspective view of a linkage system of the module of FIG. 1, according to certain aspects of the present disclosure.

FIG. 3 is a zoomed-in view of the module 100 showing details of the linkage system 130. The linkage system 130 includes a number of components that are movably coupled to the tray 110. The linkage system 130 includes a first linear body 140, a first pivoting body 150, a second linear body 160, and a second pivoting body 170. The mechanical switch 120 can be used to move the linkage system 130 and secure the module 100 to the computing device 10 (FIGS. 1 and 2), as is discussed in more detail herein.

The mechanical switch 120 includes a body portion 122, a knob 124 at an end of the body portion 122, an externally threaded portion 126 on the body portion 122, and a collar 128 that abuts the front panel 104. The body portion 122 extends through the front panel 104, where it is coupled to the linkage system 130. In FIG. 3, the mechanical switch 120 is in the unsecured position (e.g., the position where the mechanical switch 120 extends from the front panel 104 and/or the tray 110). The mechanical switch 120 can be moved to the secured position (e.g., the position where the mechanical switch 120 is retracted into the front panel 104 and/or the tray 110) by pushing the knob 124 toward the front panel 104, which causes the body portion 122 to move linearly toward and through the front panel 104. This movement of the body portion 122 causes the linkage system 130 to move and engage a portion of the computing device 10, as discussed in more detail herein. The collar 128 can have an internally threaded portion (not shown) that can mate with the externally threaded portion 126 by rotating the body portion 122 when the mechanical switch 120 is in the secured position. The mating of the threaded portions locks the mechanical switch 120 in the secured position.

The first linear body 140 is a generally straight piece of material that extends from the front panel 104 of the tray 110, back toward the first pivoting body 150. The first linear body 140 includes two channels 142A and 142B defined therein that extend in a generally linear direction between the front panel 104 and the first pivoting body 150. The first linear body 140 is slidably coupled to the tray 110 via two mounting screws 112A and 112B that can be fastened to the tray 110. The mounting screw 112A extends through the channel 142A and is screwed into the tray 110, while the mounting screw 112B extends through the channel 142B and is screwed into the tray 110.

The mounting screws 112A and 112B are screwed into the tray 110 loosely enough so that they do not restrict movement of the first linear body 140. The first linear body 140 can thus move in a linear direction between the front panel 104 and the first pivoting body 150 (e.g., towards and away from the front panel 104), as the mounting screws 112A and 112B move within the channels 142A and 142B. The length of the channels 142A and 142B defines the length of the first linear body 140's linear movement. The end of the mechanical switch 120 that extends through the front panel 104 of the module 100 and is coupled to the end of the first linear body 140 that is closest to the front panel 104.

When the mechanical switch 120 moves in a linear direction, the mechanical switch 120 causes the first linear body 140 to move in generally the same linear direction, between a first position and a second position. In the first linear body 140's first position (shown in FIG. 3), the first linear body 140 is generally positioned as close to the front panel 104 as possible, such that the mounting screws 112A and 112B are located at the ends of their respective channels 142A and 142B that are closest to the first pivoting body 150. In the first linear body 140's second position, the first linear body 140 is generally positioned closest to the first pivoting body 150 as possible, such that the mounting screws 112A and 112B are located at the ends of their respective channels 142A and 142B that are closest to the front panel 104.

When the mechanical switch 120 moves linearly from the unsecured position to the secured position, the mechanical switch 120 causes the first linear body 140 to move linearly toward the first pivoting body 150 and away from the front panel 104, such that the first linear body moves from its first position to its second position. When the mechanical switch 120 moves linearly from the secured position to the unsecured position, the mechanical switch 120 causes the first linear body 140 to move linearly towards the front panel 104 and away from the first pivoting body 150, such that the first linear body 140 moves from its second position to its first position.

The first linear body 140 is coupled to the first pivoting body 150 via a first coupler 132. The first coupler 132 can be a pin, rod, screw, etc. that extends through corresponding openings (not shown) in the first linear body 140 and the first pivoting body 150. The first coupler 132 allows the first linear body 140 and the first pivoting body 150 to rotate relative to each other. The first pivoting body 150 is pivotally coupled to the tray 110 via mounting screws 114A and 114B that can be fastened to the tray 110. The mounting screw 114A extends through an opening (not shown) in the first pivoting body 150 that is sized just larger than the mounting screw 114A, and is screwed into the tray 110. The mounting screw 114B extends through a curved channel 152 defined in the first pivoting body 150, and is screwed into the tray 110.

Similar to the mounting screws 112A and 112B, the mounting screws 114A and 114B are screwed into the tray 110 loosely enough so that they do not restrict movement of the first pivoting body 150. The first pivoting body 150 is thus able to pivot relative to the tray 110 about the mounting screw 114A, which acts as a pivot point of the first pivoting body 150. As the first pivoting body 150 pivots about the mounting screw 114A, the mounting screw 114B travels within the curved channel 152. Thus, the length of the curved channel 152 defines the angular length of the first pivoting body 150's pivoting movement.

Because the first linear body 140 and the first pivoting body 150 are rotationally coupled to each other via the first coupler 132, either of the first linear body 140 and the first pivoting body 150 can move when the other moves. Thus, when the first linear body 140 moves in a linear direction towards or away from the first pivoting body 150 (e.g., due to linear movement of the mechanical switch 120), the first linear body 140 will cause the first pivoting body 150 to pivot about the mounting screw 114A between a first position to a second position. In the first pivoting body 150's first position (shown in FIG. 3), the mounting screw 114B is generally located at the end of the curved channel 152 that is the furthest away from the front panel 104. In the first pivoting body 150's second position, the mounting screw 114B is generally located at the end of the curved channel 152 that is the closest to the front panel 104. Relative to the plane of FIG. 3, the first pivoting body 150 will pivot in a generally counter-clockwise direction from its first position to its second position, when the first linear body 140 moves away from the front panel 104 and toward the first pivoting body 150 (e.g., when the first linear body 140 moves from its first position to its second position). The first pivoting body 150 will pivot in a generally clockwise direction from its second position to its first position, when the first linear body 140 moves toward the front panel 104 and away from the first pivoting body 150 (e.g., when the first linear body 140 moves from its second position to its first position).

The first pivoting body 150 is coupled to the second linear body 160 via a second coupler 134. The second coupler 134 is generally the same as or similar to the first coupler 132, and can be a pin, rod, screw, etc. that extends through corresponding openings (not shown) in the first pivoting body 150 and the second linear body 160. The second coupler 134 allows the first pivoting body 150 and the second linear body 160 to rotate relative to each other.

The second linear body 160 is generally identical to the first linear body 140, and is a generally straight piece of material with two channels 162A and 162B defined therein. The two channels 162A and 162B extend in a generally linear direction between the first pivoting body 150 and the second pivoting body 170. The second linear body 160 is slidably coupled to the tray 110 via two mounting screws 116A and 116B that can be fastened to the tray 110. The mounting screw 116A extends through the channel 162A and is screwed into the tray 110, while the mounting screw 116B extends through the channel 162B and is screwed into the tray 110. The mounting screws 116A and 116B are screwed into the tray 110 loosely enough so that they do not restrict movement of the second linear body 160. The second linear body 160 can thus move in a linear direction between the first pivoting body 150 and the second pivoting body 170, as the mounting screws 116A and 116B move within the channels 162A and 162B. The length of the channels 162A and 162B defines the length of the second linear body 160's linear movement.

Because the first pivoting body 150 and the second linear body 160 are rotationally coupled to each other via the second coupler 134, either of the first pivoting body 150 and the second linear body 160 can move when the other moves. Thus, when the first pivoting body 150 pivots about the mounting screw 114A (e.g., due to linear movement of the mechanical switch 120 and the first linear body 140), the first pivoting body 150 will cause the second linear body 160 to move in a linear direction between a first position and a second position. In the second linear body 160's first position (shown in FIG. 3), the second linear body 160 is generally positioned as close to the second pivoting body 170 as possible, such that the mounting screws 116A and 116B are located at the ends of their respective channels 162A and 162B that are closest to the first pivoting body 150. In the second linear body 160's second position, the second linear body 160 is generally positioned as close to the first pivoting body 150 as possible, such that the mounting screws 112A and 112B are located at the ends of their respective channels 142A and 142B that are closest to the second pivoting body 170.

When the first pivoting body 150 pivots in a generally counter-clockwise direction, the first pivoting body 150 causes the second linear body 160 to move linearly towards the first pivoting body 150 and away from the second pivoting body 170, such that the second linear body 160 moves from its first position to its second position. When the first pivoting body 150 pivots in a generally clockwise direction, the first pivoting body 150 causes the second linear body 160 to move linearly towards the second pivoting body 170 and away from the first pivoting body 150, such that the second linear body 160 moves from its second position to its first position.

The second linear body 160 is coupled to the second pivoting body 170 via a third coupler 136. Similar to the first coupler 132 and the second coupler 134, the third coupler 136 can be a pin, rod, screw, etc. that extends through corresponding openings (not shown) in the second linear body 160 and the second pivoting body 170. The third coupler 136 allows the second linear body 160 and the second pivoting body 170 to rotate relative to each other. The second pivoting body 170 is generally identical to the first pivoting body 150, and is pivotally coupled to the tray 110 via mounting screws 118A and 118B that can be fastened to the tray 110. The mounting screw 118A extends through an opening (not shown) in the second pivoting body 170 that is sized just larger than the mounting screw 118A, and is screwed into the tray 110. The mounting screw 118B extends through a curved channel 172 (shown in FIG. 4C) defined in the second pivoting body 170, and is screwed into the tray 110.

Similar to the mounting screws 114A and 114B, the mounting screws 118A and 118B are screwed into the tray 110 loosely enough so that they do not restrict movement of the second pivoting body 170. The second pivoting body 170 is thus able to pivot relative to the tray 110 about the mounting screw 118A, which acts as a pivot point of the second pivoting body 170. As the second pivoting body 170 pivots about the mounting screw 118A, the mounting screw 118B travels within the curved channel 172. Thus, the length of the curved channel 172 defines the angular length of the second pivoting body 170's pivoting movement.

Because the second linear body 160 and the second pivoting body 170 are rotationally coupled to each other via the third coupler 136, either of the second linear body 160 and the second pivoting body 170 can move when the other moves. Thus, when the second linear body 160 moves in a linear direction towards or away from the second pivoting body 170 (e.g., due to linear movement of the mechanical switch 120 and the first linear body 140, and pivoting movement of the first pivoting body 150), the second linear body 160 will cause the second pivoting body 170 to pivot about the mounting screw 118A between a first position and a second position. In the second pivoting body 170's first position (shown in FIG. 3), the mounting screw 118B is generally located at the end of the curved channel 152 (visible in FIG. 4C) that is the furthest away from the front panel 104. In the second pivoting body 170's second position, the mounting screw 118B is generally located at the end of the curved channel 152 that is the closest to the front panel 104.

Relative to the plane of FIG. 3, the second pivoting body 170 will pivot in a generally counter-clockwise direction from its first position to its second position, when the second linear body 160 moves away from the first pivoting body 150 and toward the second pivoting body 170. The second pivoting body 170 will pivot in a generally clockwise direction from its second position to its first position, when the second linear body 160 moves toward the first pivoting body 150 and away from the second pivoting body 170.

Thus, movement of the mechanical switch 120 between the unsecured position and the secured position causes the first linear body 140, the first pivoting body 150, the second linear body 160, and the second pivoting body 170 to all move between their respective first positions and second positions. When the mechanical switch 120 is in the unsecured position and all of the components of the linkage system 130 are in their first positions, the linkage system 130 is in an unsecured configuration. When the mechanical switch 120 is in the secured position and all of the components of the linkage system 130 are in their second positions, the linkage system 130 is in a secured configuration. Thus, the linkage system 130 can convert the linear movement of the mechanical switch 120 into pivoting movement of the second pivoting body 170, in order to engage a portion of the computing device 10.

The first linear body 140 slides on a first linear axis that extends between the front panel 104 and the first pivoting body 150. The second linear body 160 slides on a second linear axis that extends between the first pivoting body 150 and the second pivoting body 170. The first linear axis and the second linear axis are generally perpendicular to each other. When the mechanical switch 120 moves from the unsecured position to the secured position, the first linear body 140 moves in a first linear direction toward the first pivoting body 150, and the second linear body 160 moves in a second linear direction toward the first pivoting body 150, where the first and second linear directions are perpendicular to each other. Correspondingly, when the mechanical switch 120 moves from the secured position to the unsecured position, the first linear body 140 moves in a third linear direction away from the first pivoting body 150, and the second linear body 160 moves in a fourth linear direction away from the first pivoting body 150, where the third and fourth linear directions are perpendicular to each other.

In contrast, moving the mechanical switch 120 from the unsecured position to the secured position causes the first pivoting body 150 and the second pivoting body 170 to pivot in the same pivoting direction, which is generally counterclockwise relative to the plane of FIG. 3. Moving the mechanical switch 120 from the secured position to the unsecured position causes the first pivoting body 150 and the second pivoting body 170 to each pivot in the opposite pivoting direction, which is generally clockwise relative to the plane of FIG. 3. Thus, while the first linear body 140 and the second linear body 160 generally move in perpendicular linear directions in response to the mechanical switch 120 moving between the unsecured position and the secured position, the first pivoting body 150 and the second pivoting body 170 generally move in identical pivoting directions.

In some implementations, the mechanical switch 120 is biased toward the unsecured position, such that the linkage system 130 is biased toward the unsecured configuration. For example, a spring can be coupled between the front panel 104 and the end of the mechanical switch 120 that extends through the front panel 104. When the mechanical switch 120 is moved to the secured position, this end of the mechanical switch 120 extends away from the front panel 104 toward the first pivoting body 150, thereby stretching the spring. If the force that caused the mechanical switch 120 to move to the secured position is removed (and the mechanical switch 120 is not locked into the secured position), the spring will compress and cause the mechanical switch 120 to automatically move back to the expanded position, and also cause the linkage system 130 to automatically move back to the unsecured configuration.

While FIG. 3 illustrates the use of screws to couple the various components of the linkage system 130 to the tray 110, other types of fasteners could be used. For example, in some implementations, the module 100 may include rods or pins that extend through the various channels defined in the components of the linkage system 130. In other implementations, the components of the linkage system 130 can be coupled to the tray 110 in other manners, so long as the components of the linkage system 130 are still able to move between their respective first and second positions in response to the mechanical switch 120 moving between the unsecured position and the secured position.

Figure 4A:
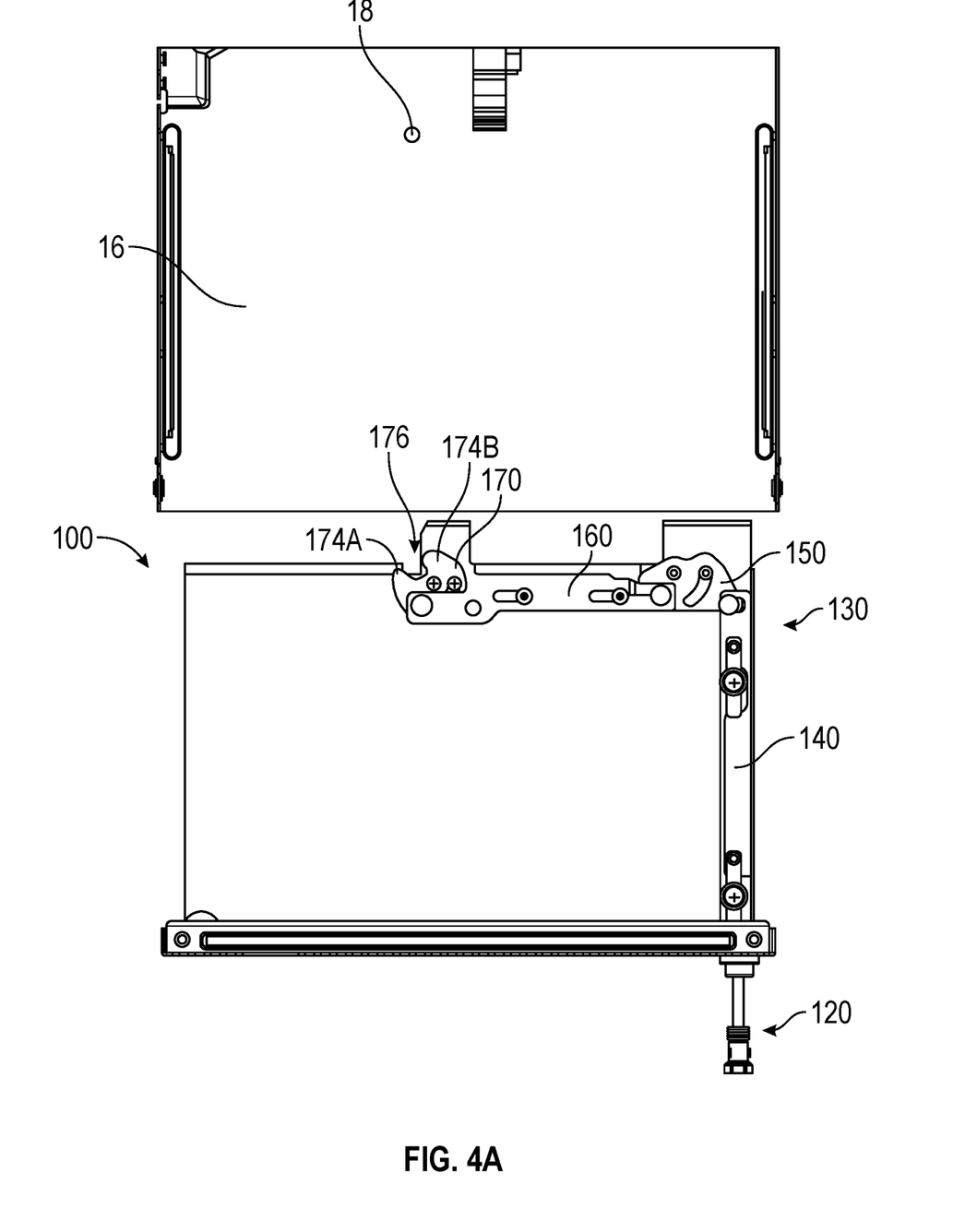
FIG. 4A. is a top view of the linkage system of the module being in an unsecured configuration, prior to being inserted into the sled, according to certain aspects of the present disclosure.
Figure 4B:
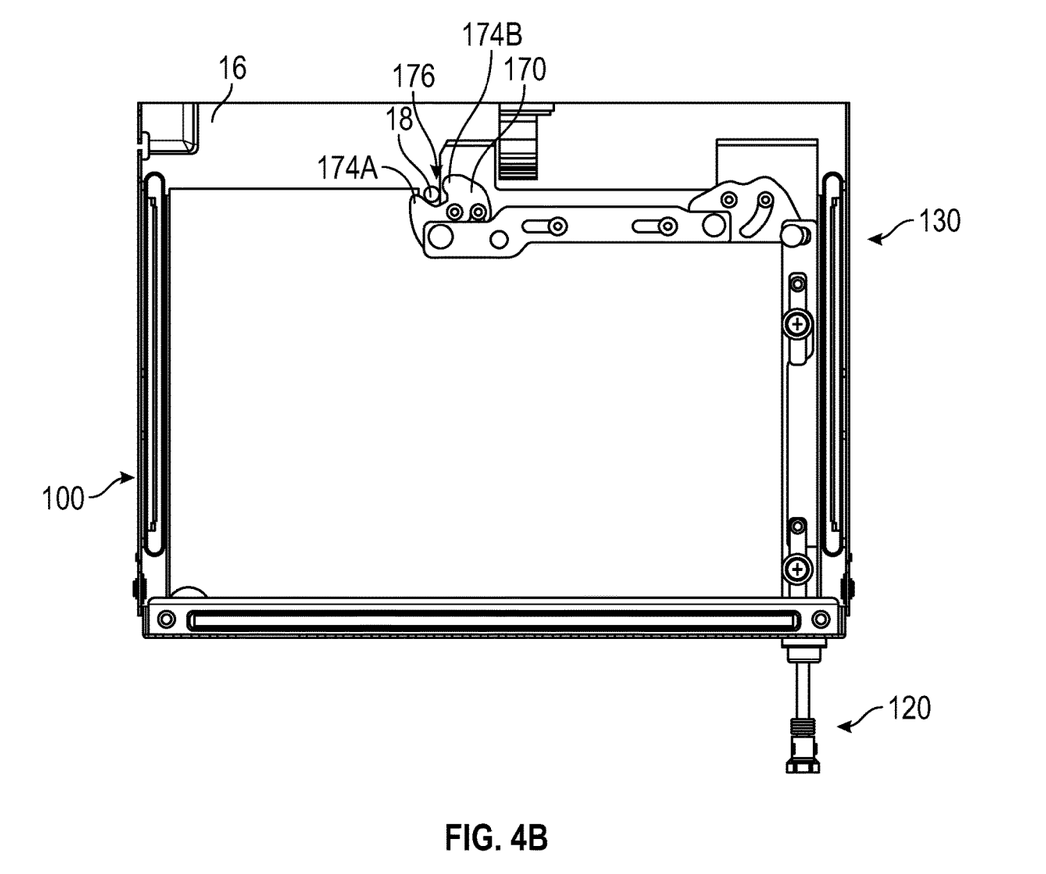
FIG. 4B. is a top view of the linkage system of the module being in the unsecured configuration, after being inserted into the sled, according to certain aspects of the present disclosure.
Figure 4C:
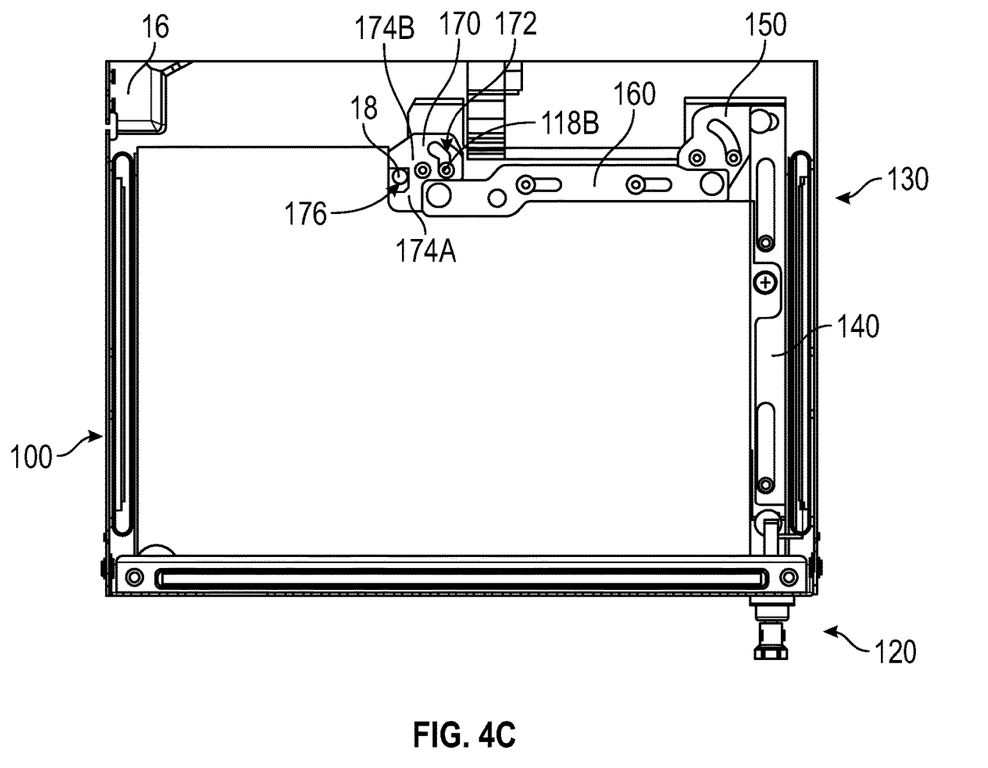
FIG. 4C. is a top view of the linkage system of the module being in a secured configuration, after to being inserted into the sled, according to certain aspects of the present disclosure.

FIGS. 4A, 4B, and 4C show top views of the module 100 being coupled and locked to the computing device by being inserted into and secured to the sled 16. In FIG. 4A, the module 100 has not yet been inserted into the sled 16, and thus is not coupled to the computing device 10. The mechanical switch 120 is in the unsecured position, and the linkage system 130 is in the unsecured configuration. In the unsecured configuration, the first linear body 140, the first pivoting body 150, the second linear body 160, and the second pivoting body 170 are all in their respective first positions. The sled 16 includes the protrusion 18 that the linkage system 130 can engage when the module 100 is inserted into the sled 16. The second pivoting body 170 includes two jaws 174A and 174B that extend outward, and a small groove 176 that is defined between the jaws 174A and 174B. The groove 176 receives the protrusion 18 therein when the module 100 is inserted into the sled 16.

In FIG. 4B, the module 100 has been inserted into the sled 16, and thus the module 100 is coupled to the computing device 10. The mechanical switch 120 is still in the unsecured position, and thus the linkage system 130 remains in the unsecured configuration. When the module 100 is inserted into the sled 16 while the linkage system 130 is in the unsecured configuration (and thus the second pivoting body 170 is in its first position), the groove 176 receives the protrusion 18 of the sled 16 between the jaws 174A and 174B. Because the jaws 174A and 174B are located on either side of the protrusion 18 along an axis that is perpendicular to an axis along which the module 100 slides into and out of the sled 16, the module 100 can still be removed from the sled 16. Thus, when the module 100 is coupled to the computing device 10 and the linkage system 130 is in the unsecured configuration, the linkage system 130 is disengaged from a portion of the computing device 10 (e.g., the protrusion 18 of the sled 16), such that the linkage system 130 is unlocked from the computing device 10 and can be decoupled from the computing device 10.

In FIG. 4C, the mechanical switch 120 has been moved to the secured position (e.g., by a user), which moves the linkage system 130 to the secured configuration. As shown, when the linkage system 130 is in the secured configuration, the first linear body 140, the first pivoting body 150, the second linear body 160, and the second pivoting body 170 are all in their respective second positions. FIG. 4C shows the curved channel 172 of the second pivoting body 170, and that the mounting screw 118B is positioned at the end of the curved channel 172 furthest away from the front panel 104. When the second pivoting body 170 pivots to its second position, the protrusion 18 of the sled 16 remains seated within the groove 176. However, the jaws 174A and 174B are now located on either side of the protrusion 18 along an axis that is parallel to the axis along which the module 100 slides into and out of the sled 16. If the user attempts to remove the module 100 from the sled 16 when the linkage system 130 is in the secured configuration, the jaw 174B of the second pivoting body 170 will contact the protrusion 18 and prevent the module 100 from the being removed. The jaw 174A also aids in preventing the module 100 from being inserted further into the sled 16 as well. Thus, when the module 100 is coupled to the computing device 10 and the linkage system 130 is in the secured configuration, the linkage system 130 is engaged with a portion of the computing device 10 (e.g., the protrusion 18 of the sled 16), such that the linkage system 130 is locked to the computing device 10 and cannot be decoupled from the computing device 10.

Moving the mechanical switch 120 to the secured position when the module 100 is coupled to the computing device 10 (e.g., when the module 100 is inserted into the sled 16) causes the linkage system 130 to move to the secured position, and engage a portion of the computing device 10 (e.g., the protrusion 18 of the sled 16). The module 100 is thus locked to the computing device 10 and cannot be decoupled from the computing device 10. To decouple the module 100 from the computing device 10 (e.g., to remove the module 100 from the sled 16), the mechanical switch 120 is moved to the unsecured position, such that the linkage system 130 moves to the unsecured configuration and disengages from the portion of the computing device 10.

The illustrated implementation shows the module 100 being inserted into the sled 16 and the linkage system 130 engaging a portion of the sled 16. The sled 16 is then inserted into a slot of the computing device 10. However, in other implementations, the module 100 can be inserted directly into a slot of the computing device 10, where the linkage system 130 can then engage a portion of the computing device 10.

Other configurations of the linkage system 130 can also be used. For example, in some implementations, the linkage system 130 includes more than two linear bodies, and/or more than two pivoting bodies. In other implementations, the linkage system 130 includes a single linear body, a single pivoting body, or both a single linear body and a single pivoting body. In general, the linkage system 130 includes at least one linear body, at least one pivoting body, or at least one linear body and at least one pivoting body. Further, while the illustrated implementation shows the mechanical switch 120 that moves in a linear direction, other implementations could use a pivoting component, such as a knob. These implementations could include a linkage system that converts the pivoting movement of the knob into linear and/or pivoting movement, in order to engage a portion of the computing device 10.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A module configured to be coupled to a computing device, the module comprising:
    a tray configured to receive a circuit board thereon;
    a mechanical switch coupled to the tray and movable between an unsecured position and a secured position; and
    a linkage system mechanically coupled to the mechanical switch, the linkage system being movable between an unsecured configuration and a secured configuration in response to the mechanical switch moving between the unsecured position and the secured position, the linkage system including a (i) first linear body coupled to the mechanical switch, (ii) first pivoting body coupled to the first linear body and pivotally coupled to the tray via a first pivot point, (iii) a second linear body coupled to the first pivoting body, and (iv) a second pivoting body coupled to the second linear body and pivotally coupled to the tray via a second pivot point,
    wherein when the module is coupled to the computing device and the linkage system is in the secured configuration, the second pivoting body of the linkage system is engaged with a portion of the computing device, such that the module is locked to the computing device, and
    wherein when the module is coupled to the computing device and in the unsecured configuration, the second pivoting body of the linkage system is disengaged from the portion of the computing device, such that the module is unlocked from the computing device.

2. The module of claim 1, wherein the mechanical switch moves linearly between the unsecured position and the secured position, the linkage system converting the linear movement of the mechanical switch into pivoting movement to engage the portion of the computing device.

3. The module of claim 1, wherein:
    in response to the mechanical switch moving between the unsecured position and the secured position, the first linear body moves linearly between a first position and a second position;
    in response to the first linear body moving linearly between the first position and the second position, the first pivoting body pivots between a first position between a second position;
    in response to the first pivoting body pivoting between the first position and the second position, the second linear body moves linear between a first position and a second position; and
    in response to the second linear body moving linearly between the first position and the second position, the second pivoting body pivots between a first position and a second position.

4. The module of claim 3, wherein when the second pivoting body pivots from the first position to the second position, the second pivoting body engages the portion of the computing device, and wherein when the second pivoting body pivots from the second position to the first position, the second pivoting body disengages from the portion of the computing device.

5. The module of claim 1, wherein the tray is receivable by a sled that can be inserted into a slot defined in a housing of the computing device to thereby couple the module to the computing device, the sled having a protrusion extending therefrom, and wherein when the tray is received by the sled and the mechanical switch moves from the unsecured position to the secured position, the second pivoting body pivots from a first position to a second position to engage the protrusion.

6. The module of claim 5, wherein the second pivoting body includes a first jaw, a second jaw, and a groove defined between the first jaw and the second jaw, the protrusion being received within the groove when the tray is received within the slot and the second pivoting body pivots to the second position, such that the first jaw and the second jaw prevent the tray from being removed from the slot.

7. The module of claim 1, wherein movement of the mechanical switch between the unsecured position and the secured position causes the first linear body to move linearly relative to the tray.

8. The module of claim 7, wherein the linear movement of the first linear body causes the first pivoting body to pivot relative to the tray about the first pivot point.

9. The module of claim 8, wherein the pivoting movement of the first pivoting body causes the second linear body to move linearly relative to the tray.

10. The module of claim 9, wherein when the module is coupled to the computing device, the linear movement of the second linear body causes the second pivoting body to pivot relative to the tray about the second pivot point such that the second pivoting body engages the portion of the computing device.

11. The module of claim 1, wherein the mechanical switch moves linearly between the unsecured position and the secured position.

12. The module of claim 11, wherein the linear movement of the mechanical switch causes (i) the first linear body to move in a first linear direction and the second linear body to move in a second linear direction that is perpendicular to the first linear direction, and (ii) the first pivoting body and the second pivoting body to pivot in identical pivoting directions to the tray about their respective pivot points.

13. The module of claim 1, wherein the tray is insertable into the computing device only when the linkage system is in the unsecured configuration.

14. The module of claim 13, wherein the tray is insertable into (i) a slot defined in the computing device, or (ii) a sled that can be inserted into the slot defined in the computing device.

15. The module of claim 1, wherein the mechanical switch includes an externally threaded portion and a collar that abuts the tray, the collar having an internally threaded portion.

16. The module of claim 15, wherein the externally threaded portion of the mechanical switch engages the internally threaded portion of the collar in response to the mechanical switch being rotated while in the secured position, thereby locking the mechanical switch in the secured position.

17. The module of claim 1, wherein the mechanical switch is biased toward the unsecured position, such that the linkage system is biased toward the secured configuration.

18. A system comprising:
a computing device having a slot defined therein, and including a sled receivable within the slot; and
a module receivable within the sled, the module including:
a tray configured to receive a circuit board thereon and to be inserted into the sled;
a mechanical switch coupled to the tray and movable between an unsecured position and a secured position; and
a linkage system mechanically coupled to the mechanical switch, the linkage system being movable between an unsecured configuration and a secured configuration in response to the mechanical switch moving between the unsecured position and the secured position, the linkage system including a (i) first linear body coupled to the mechanical switch, (ii) a first pivoting body coupled to the first linear body and pivotally coupled to the tray via a first pivot point, (iii) a second linear body coupled to the first pivoting body, and (iv) a second pivoting body coupled to the second linear body and pivotally coupled to the tray via a second pivot point,
wherein when the module is received within the sled and the linkage system is in the secured configuration, the second pivoting body of the linkage system is engaged to a portion of the sled, such that the module is locked to the sled, and
wherein when the module is received within the sled and the linkage system is in the unsecured configuration, the second pivoting body of the linkage system disengaged from the portion of the sled, such that the module is unlocked from the sled.

* * * * *